United States Patent [19]
Yamabe et al.

[11] Patent Number: 5,259,883
[45] Date of Patent: Nov. 9, 1993

[54] METHOD OF THERMALLY PROCESSING SEMICONDUCTOR WAFERS AND AN APPARATUS THEREFOR

[75] Inventors: Kikuo Yamabe; Katsuya Okumura, both of Yokohama, Japan

[73] Assignee: Kabushiki Kaisha Toshiba, Kawasaki, Japan

[21] Appl. No.: 27,575

[22] Filed: Mar. 5, 1993

Related U.S. Application Data

[63] Continuation of Ser. No. 807,405, Dec. 12, 1991, abandoned, which is a continuation of Ser. No. 311,355, Feb. 16, 1989, abandoned.

[30] Foreign Application Priority Data

Feb. 16, 1988 [JP] Japan .................................. 63-33429
Jun. 23, 1988 [JP] Japan ................................. 63-153505

[51] Int. Cl.⁵ .............................................. C23C 16/00
[52] U.S. Cl. ..................................... 118/725; 118/724; 219/390
[58] Field of Search .................. 118/724, 725; 219/390

[56] References Cited

U.S. PATENT DOCUMENTS

| | | | |
|---|---|---|---|
| 2,145,324 | 1/1939 | Stauss | 219/390 |
| 3,047,438 | 7/1962 | Marinace | 437/90 |
| 3,171,755 | 3/1965 | Reuschel | 118/725 |
| 3,314,393 | 4/1967 | Haneta | 118/725 |
| 3,473,510 | 10/1969 | Sheng | 118/724 |
| 3,828,722 | 8/1974 | Reuter | 118/725 |
| 4,284,867 | 8/1981 | Hill | 118/724 |
| 4,293,590 | 10/1981 | Takagi | 118/733 |

FOREIGN PATENT DOCUMENTS 57-211729 12/1982 Japan .
58-219733 12/1983 Japan .

OTHER PUBLICATIONS

Semiconductor World (Monthly), Takamasa Sakai et al. (Dai Nihon Screen Man.) Jan. 1987, p. 43, New High Speed Heat Treating Furnace.

*Primary Examiner*—Richard Bueker
*Attorney, Agent, or Firm*—Cushman, Darby & Cushman

[57] ABSTRACT

An apparatus for thermally processing semiconductor wafers within a reaction tube in which the wafers are thermally processed in a higher temperature region within the reaction tube. The thermally processed semiconductor waters are moved into a lower temperature region within the reaction tube. The rate of heat radiated from the thermally processed semiconductor waters is reduced in the lower temperature region within the reaction tube.

13 Claims, 8 Drawing Sheets

METHOD OF THERMALLY PROCESSING SEMICONDUCTOR WAFERS AND AN APPARATUS THEREFOR

This is a continuation of application Ser. No. 07/807,405, filed on Dec. 12, 1991, which was abandoned upon the filing hereof, which is a continuation of application Ser. No. 07/311,355 filed on Feb. 16, 1989, now abandoned.

BACKGROUND OF THE INVENTION

1. Field of the Invention

This invention relates to an improved method of thermally processing semiconductor wafers and an apparatus therefor. The apparatus improves the manner in which temperature is raised and reduced for thermal processes within a reaction tube.

2. Description of the Prior Art

In the manufacturing process of semiconductor integrated circuits, semiconductor wafers have typically been introduced into a thermal processing apparatus having an atmosphere at a high temperature of about 1000° C. In the apparatus, the semiconductor wafers undergo thermal oxidation and other thermal processes. To enhance the uniformity of the temperature distribution within the apparatus, an heat insulating material is provided in the vicinity of a heater. Further, a tube for distributing heat evenly, made of silicon carbide or the like, is provided between the heater and a process tube. As a result, the heat capacity of the thermal processing apparatus becomes inevitably large. Thus, the apparatus consumes considerable time while raising and reducing temperatures before and after the thermal oxidation or other thermal processing at the prescribed temperatures. This reduces the productivity of semiconductor wafer manufacturing process. Further, the depth of an impurity diffusion layer cannot be controlled to remain small as required.

If the semiconductor wafers are rapidly taken out from the apparatus after the predetermined thermal processes, such as oxidation and impurity diffusion, the semiconductor wafers experience a large temperature change. As a result, the wafer surface is deformed due to "slip" or "warp". Such "slip" or "warp" causes defects in the crystal lattice.

Therefore, in place of the above-described apparatus, a semiconductor wafer thermal processing apparatus utilizing a lamp heater technique has been developed. In the lamp heater technique, the apparatus causes semiconductor wafers to absorb light radiated from a light source provided in the apparatus. As a result, only the wafer temperature is raised. Thus, the heat capacity of the apparatus is significantly smaller than the above-described heater type apparatus. Therefore, the apparatus has advantages in that a speed of raising and reducing temperature is significantly higher. However, the apparatus also has a disadvantage in that the thermal process is performed while the temperature is unstable, in that when the wafer surfaces reach a predetermined temperature, the heater power source is automatically turned off before the interior of the wafer achieves the same temperature as the surface. Also, a speed of raising the temperature varies with the impurity concentration of the semiconductor wafers due to the manner in which the impurities alter the energy absorption of the wafers.

Moreover, there has been also disclosed a thermal processing apparatus based on a combined technique of the heater type and the lamp heater type. Specifically, in such an apparatus, a heater and a lamp are provided between a reflector and a quartz reaction tube. Therefore, the heat capacity of a heater portion constituted by the heater and the lamp is reduced. Thus, a speed of raising and reducing the temperature in the reaction tube is increased. As a result, this compound-type apparatus has a temperature reducing speed higher than that of the heater type thermal processing apparatus. Further, the compound-type apparatus can achieve a temperature raising speed independent of the impurity concentration of the semiconductor wafers to be processed. Therefore, the compound-type apparatus has become recognized as a satisfactory thermal processing apparatus.

However, this apparatus still has a disadvantage as follows. Specifically, when the heater of the apparatus is energized up to its maximum output so as to achieve a thermal process at a higher temperature, the heat capacity of the apparatus increases. Thus, a temperature reducing speed of the apparatus is inevitably reduced. As a result, there has been a compromising relationship between higher-temperature thermal processing and higher-speed temperature reduction.

SUMMARY OF THE INVENTION

Accordingly, one object of this invention is to provide a method of thermally processing semiconductor wafers comprising the steps of thermally processing the semiconductor wafers at a higher temperature, and rapidly releasing the semiconductor wafers from the thermal process by use of a high-speed temperature reducing technique.

Another object of this invention is to provide a semiconductor wafer thermal processing apparatus suitable for thermal processes of various kinds, which can simultaneously achieve a higher-temperature thermal processing and a higher-speed temperature reduction.

Briefly, in accordance with one aspect of this invention, semiconductor wafers are thermally processed in a higher temperature region within a reaction tube. Then the thermally processed semiconductor wafers are moved into a lower temperature region within the reaction tube. At this time radiation of heat from said thermally processed semiconductor wafers in the lower temperature region within the reaction tube is suppressed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Referring now to the drawings, wherein like reference numerals designate identical or corresponding parts throughout the several views, and more particularly to FIG. 1 thereof, one embodiment of this invention will be described.

Figure 1:
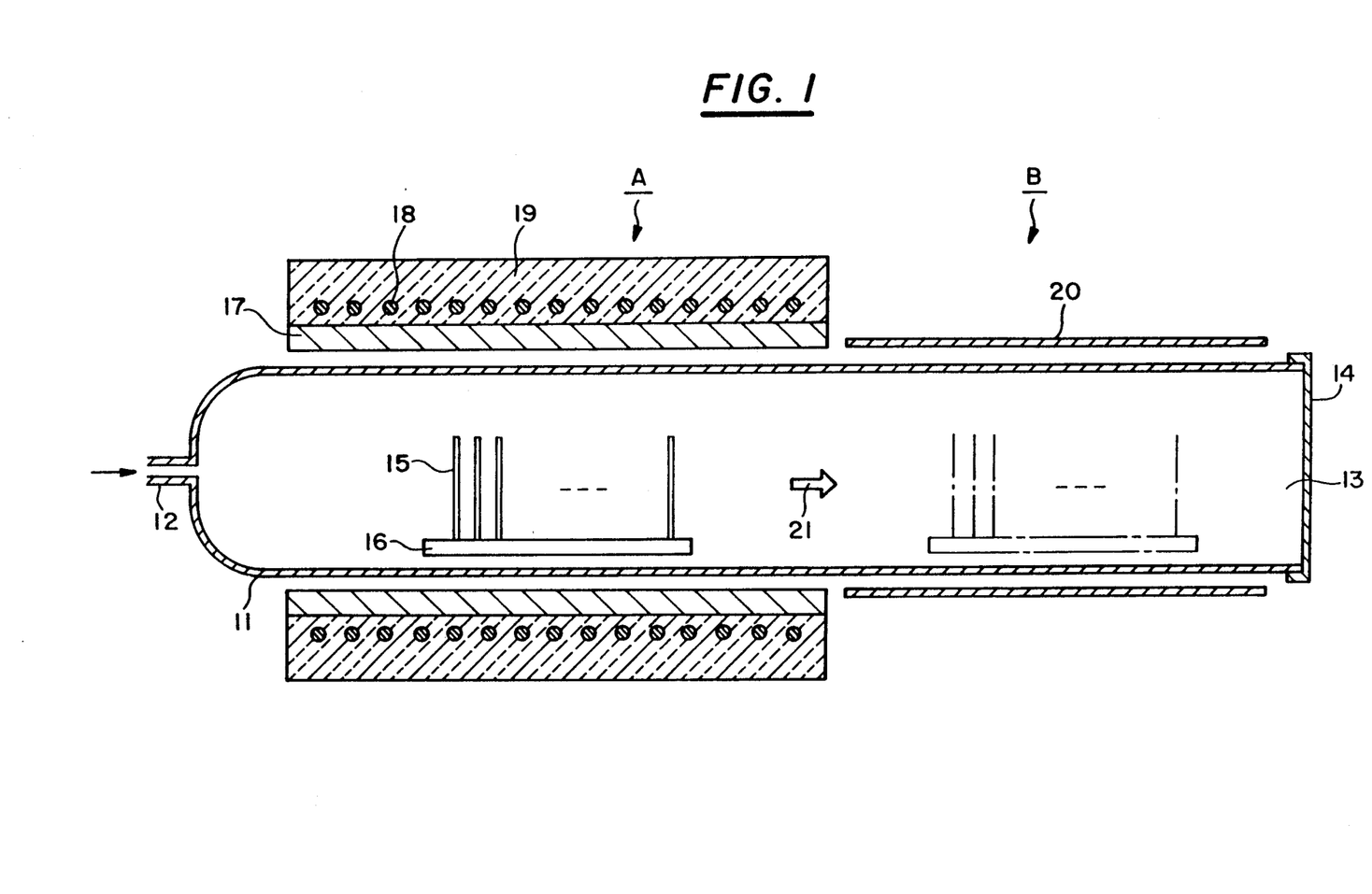
FIG. 1 is a schematic cross-sectional view illustrating a first embodiment of the present invention.

FIG. 1 shows a horizontal type reaction furnace according to a first embodiment of the present invention. In FIG. 1, a gas-introducing tube 12 is provided at one end in a longitudinal direction of a long quartz reaction tube 11. The reaction tube 11 has an opening 13 at the other end thereof. The opening 13 is closed by a detachable quartz cap 14. A plurality of semiconductor wafers 15 to be thermally processed are placed in parallel to each other on a quartz boat 16. Specifically, the semiconductor wafers 15 are placed perpendicularly on the quartz boat 16. The quartz boat 16 loaded with the semiconductor wafers 15 passes into and from the reaction tube, through the opening 13.

The reaction tube 11 is provided with a higher temperature region A and a lower temperature region B. The higher temperature region A is situated at a portion near the gas-introducing tube 12, i.e., far away from the opening 13. The lower temperature region B is situated at a portion near the opening 13. In the higher temperature region A, a heater 18 is provided around the reaction tube 11. A tube 17 made of silicon carbide for uniformly distributing heat is interposed between heater 18 and reaction tube 11. The heater 18 is covered with an adiabator or heat insulating material 19. Thus, the heat radiation to the outer periphery of the reaction furnace 11 is suppressed.

In the lower temperature region B, a reflector 20 is provided around the reaction tube 11. The reflector 20 is a quartz tube having the inner surface coated with a metal film having a mirror finish. The metal film may be films of gold, platinum or aluminum, and has satisfactory heat reflection characteristics.

Next, an example of a thermal oxidation process for semiconductor wafers, by use of the above-described reaction furnace 11, will be described. The quartz boat 16, loaded with plural semiconductor wafers 15, is introduced into the higher temperature region A within the reaction tube 11. The semiconductor wafers 15 are exposed to an atmosphere of 1000° C. for a prescribed period of time so as to undergo a thermal oxidation process. After the thermal oxidation process, the heater 18 is turned off. Thereafter, the quartz boat 16, loaded with plural semiconductor wafers 15, is moved into the lower temperature region B as shown by arrow 21 in FIG. 1. In the lower temperature region B, the semiconductor wafers 15 are cooled down to a temperature below about 500° C. Next, the quartz cap 14 is opened and then, the quartz boat 16, loaded with plural semiconductor wafers 15, is moved out from the reaction tube 11.

Figure 2A:
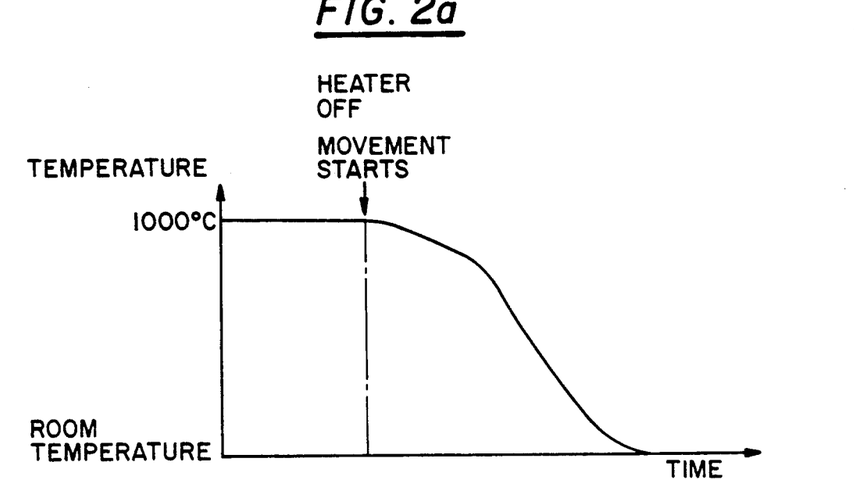
FIG. 2a through 2c are graphs illustrating temperature characteristics of the first embodiment according to the present invention in comparison with those of conventional apparatus.
Figure 2B:
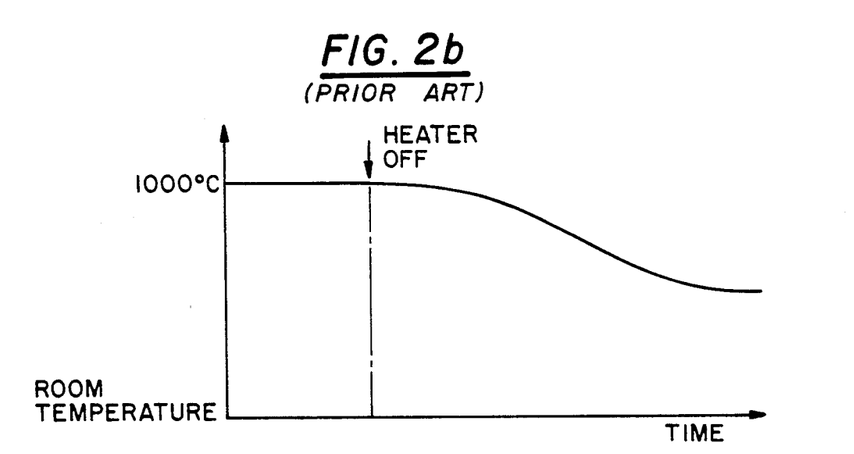
Figure 2C:
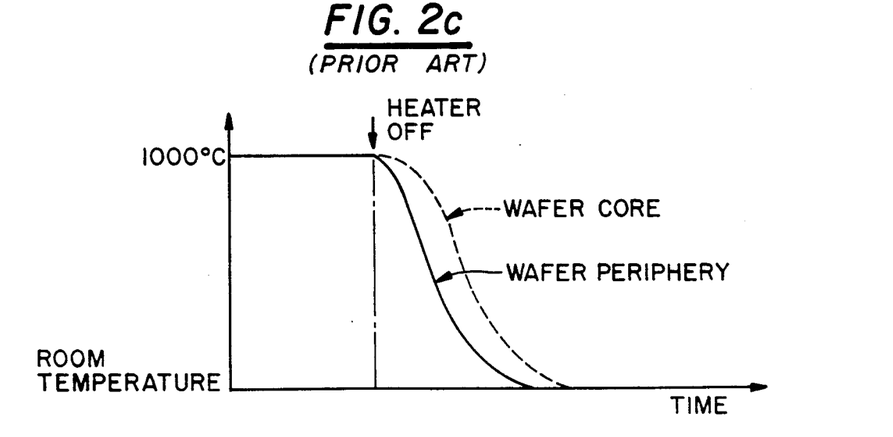

FIG. 2a shows a cool-down curve of the semiconductor wafers in this embodiment. For the sake of comparison, FIG. 2b shows a natural cool-down curve of semiconductor wafers in a conventional apparatus having a large heat capacity. In such an apparatus, after a thermal oxidation process, a heater is turned off, and then the semiconductor wafers are naturally cooled down without any movement. FIG. 2c shows a cool-down curve of semiconductor wafers in another conventional apparatus using a lamp heater technique. As seen from the three cool-down curves, the semiconductor wafers in this embodiment are cooled down at an intermediate temperature reducing speed between the speeds of the conventional apparatus shown respectively in FIGS. 2b and 2c.

In this embodiment, after the prescribed thermal processes, the semiconductor wafers 15 are moved from the higher temperature region A into the lower temperature region B and are cooled down therein. The reflector 20 is provided in the outer periphery of the lower temperature region B. Thus, the heat radiated from the semiconductor wafers 15 is suppressed. Therefore, the cool-down speed of the semiconductor wafers is properly controlled. As a result, the semiconductor wafers are rapidly cooled down while maintaining a uniform temperature distribution in each wafer and between respective wafers. This can prevent the occurrence of "slip" or "warp" of the semiconductor wafers, and can enhance the manufacturing productivity thereof.

Next, a second embodiment of this invention will be described with reference to FIG. 3. In the embodiment of FIG. 1, the heater 18 is provided only in the higher temperature region A, while in the lower temperature region B, the reflector 20 is provided instead. However, in the second embodiment, a heater is provided not only in a higher temperature region, but also in a lower temperature region. In the second embodiment, a vertical-type reaction tube is utilized, while in the first embodiment, the horizontal type reaction tube is used.

Figure 3:
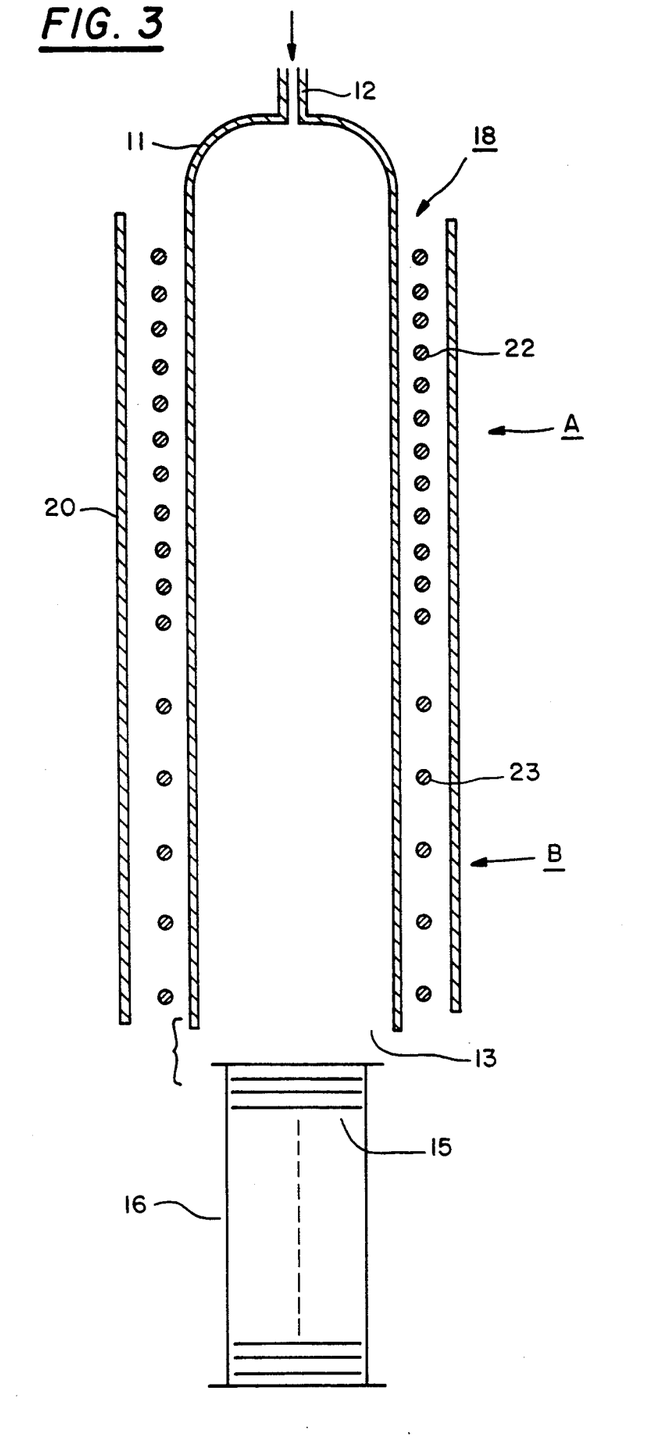
FIG. 3 is a cross-sectional view illustrating a second embodiment of the present invention.

In FIG. 3, a quartz reaction tube 11 is provided with an opening at the lower portion thereof, and a gas-introducing inlet 12 at the upper portion thereof. A heater 18 is provided around the quartz reaction tube 11. The heater 18 is divided into a higher temperature heater 22 and a lower temperature heater 23. Both heaters 22 and 23 are formed using the heater windings of the same material and the same diameter. The heater winding of the heater 22 is wound with a higher density around the upper portion of the quartz reaction tube 11 so as to have a larger heat capacity. The heater winding of the heater 23 is wound with a lower density around the lower portion of the quartz reaction tube 11 so as to have smaller heat capacity. Thus, the higher temperature heater 22 is disposed in a higher temperature region A, and the lower temperature heater 23 is disposed in a lower temperature region B. Further, a reflector 20 is provided at the outer periphery of the heater 18. The reflector 20 is a quartz tube having the inner surface coated with a gold film, for example. A plurality of semiconductor wafers 15 to be thermally processed are placed on a quartz boat 16. The quartz boat 16 loaded with plural semiconductor wafers 15 is introduced into the quartz reaction tube 11 passing through the opening 13.

Figure 4A:
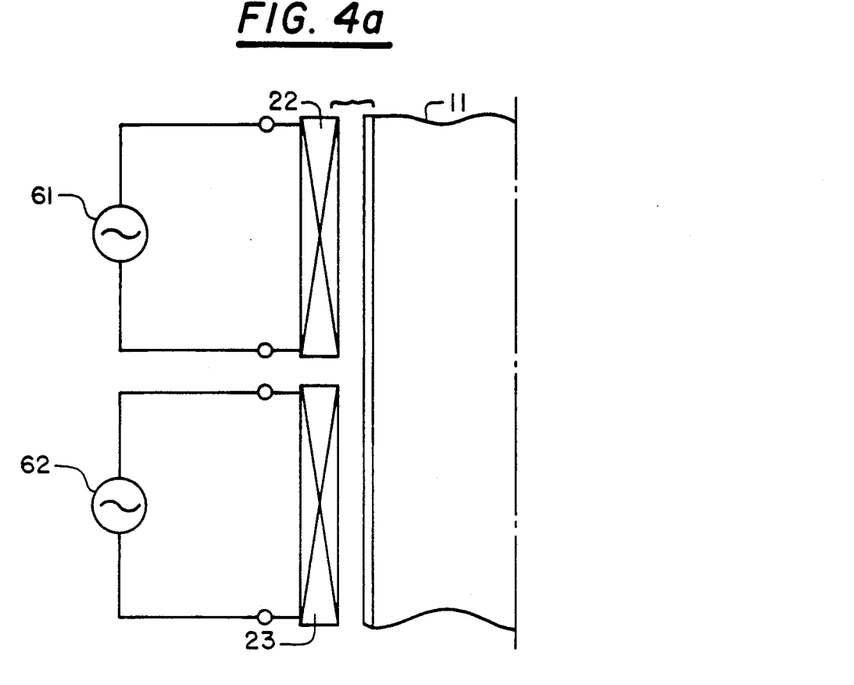
FIGS. 4a and 4b are schematic circuit diagrams of heaters for use in the second embodiment and a fourth embodiment of the present invention.
Figure 4B:
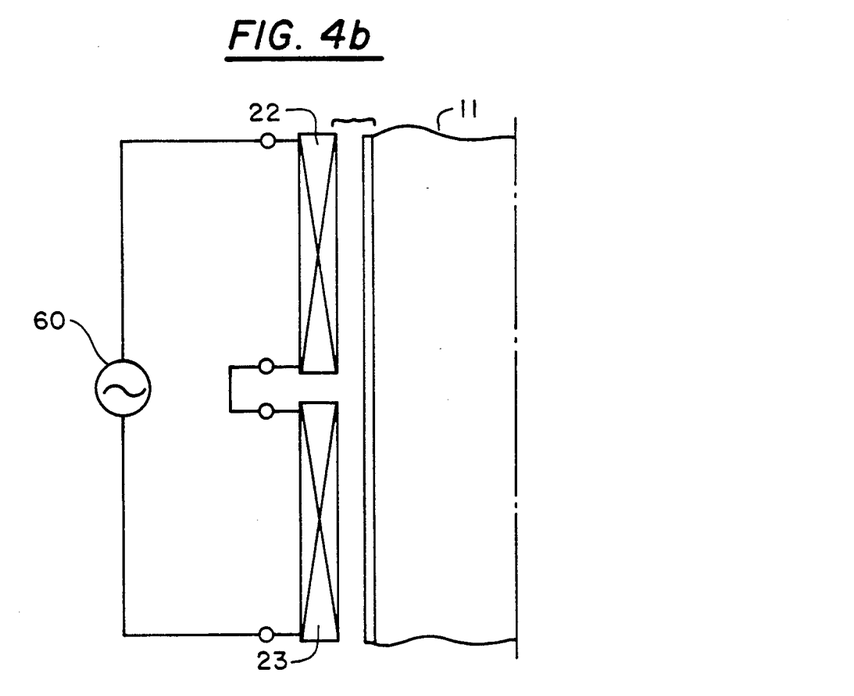

The higher temperature heater 22 and the lower temperature heater 23 are energized respectively by separate power sources 61 and 62 as shown in FIG. 4a. The heaters 22 and 23 may also be energized by a single power source 60 as shown in FIG. 4b. In the case of FIG. 4a, when the heaters 22 and 23 are energized by the same amount of current, the heater 22 generates more heat than the heater 23 does. This is because the number of turns of the winding of heater 22 is greater than that of the heater 23. In the case of FIG. 4b, the heater 22 also generates more heat than the heater 23 does for the same reason.

In the above-described apparatus, the semiconductor wafers 15 are thermally processed as follows. First, the quartz boat 16, loaded with plural semiconductor wafers (silicon wafers) 15, is prepared outside of the quartz reaction tube 11. Next, dry oxygen is introduced into the reaction tube 11. Thereafter, the temperature of the higher temperature region A is raised by the heater 22 up to and maintained at about 500° C. The temperature of the lower temperature region B is maintained at about room temperature if the circuit of FIG. 4a is employed. Then, after processing, the quartz boat 16, loaded with plural silicon wafers 15, is introduced into the lower temperature region B. Thereafter, the temperature of the lower temperature region B is raised by the heater 23 up to about 500° C. Next, the quartz boat 16 loaded with the wafers 15 is moved into the higher temperature region A. Then, the temperature of the higher temperature region A is raised by the heater 22 up to about 1000° C. The wafers 15 are exposed to an atmosphere of dry oxygen at about 100° C. for about 60 minutes so that a prescribed thermal oxidation is performed. Next, the temperature of the region A is reduced to about 500° C. by reducing the current passing through heater 22. Thereafter, the boat 16 loaded with the wafers 15 is moved to the region B. Next, the temperature of the region B is reduced to room temperature by reducing the current passing through heater 23.

Figure 5:
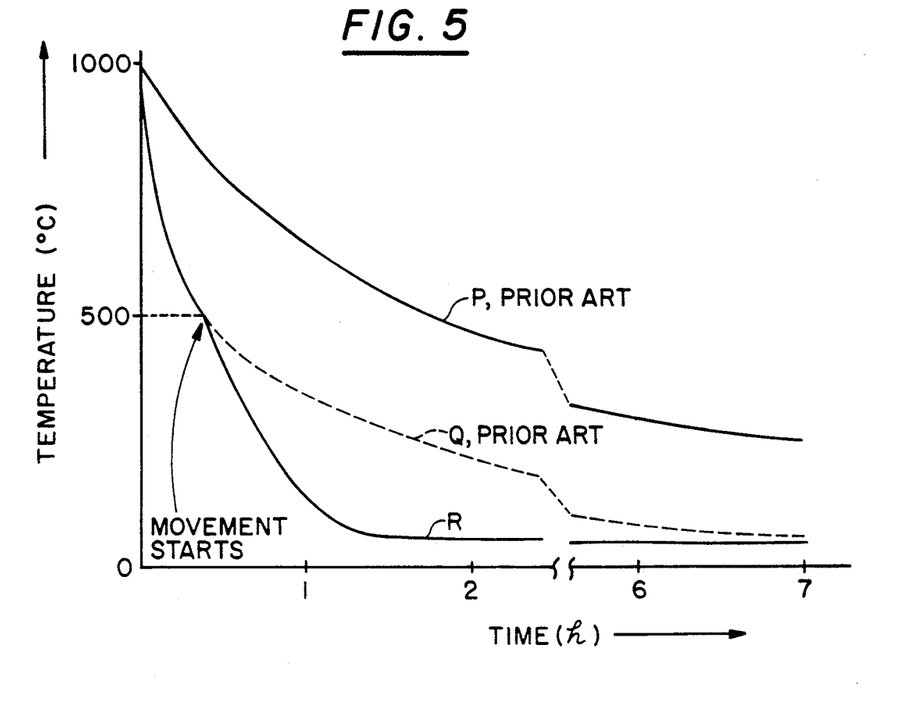
FIG. 5 is a graph illustrating temperature characteristics of the second embodiment according to the present invention in comparison with those of conventional apparatus.

FIG. 5 is a graph illustrating the results of measuring the temperature changes of the silicon wafers 15 with respect to time during the above-described processes in the second embodiment of this invention, (curve R). For the sake of comparison, the measuring results in the cases of conventional apparatus are also illustrated, (curves P and Q). The curve P shows the case of a conventional heater-type apparatus, wherein considerable time is required after the specified thermal process at about 1000° C. The curve Q shows the case of a conventional apparatus having a reflector around a heater. However, this conventional apparatus has a single temperature region alone, i.e., no distinction such as higher- and lower-temperature regions. The curve Q indicates that a temperature reducing speed after thermal processing is higher than the curve P. Nevertheless, this conventional apparatus still consumes considerable time before a sufficiently lower temperature (e.g., room temperature) is obtained.

In contrast to this, the thermal processing apparatus in this embodiment according to the present invention has satisfactory temperature reducing characteristics as shown in the curve R. Specifically, the curve R is substantially the same as the curve Q until it reaches an instant at which the wafer movement starts after the heater 18 has been turned off. However, after such an instant, the curve R goes down within a sufficiently short time and reaches room temperature. This indicates that the temperature reducing time in the apparatus of this invention can be curtailed by about 5 hours at least, as compared to the curve Q of the conventional apparatus.

Figure 6A:
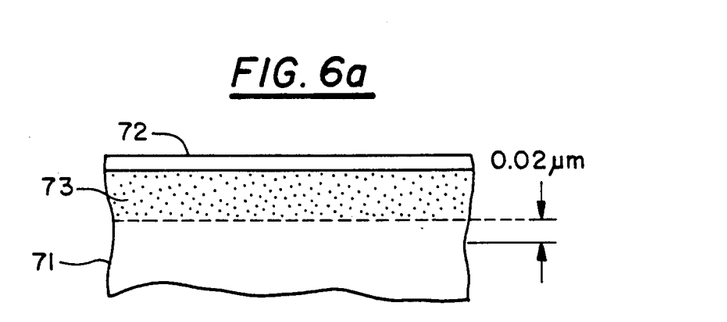
FIG. 6 is a cross-sectional view illustrating a comparison of semiconductor wafers processed by thermal diffusion in the second embodiment of the present invention and conventional apparatus.
Figure 6B:
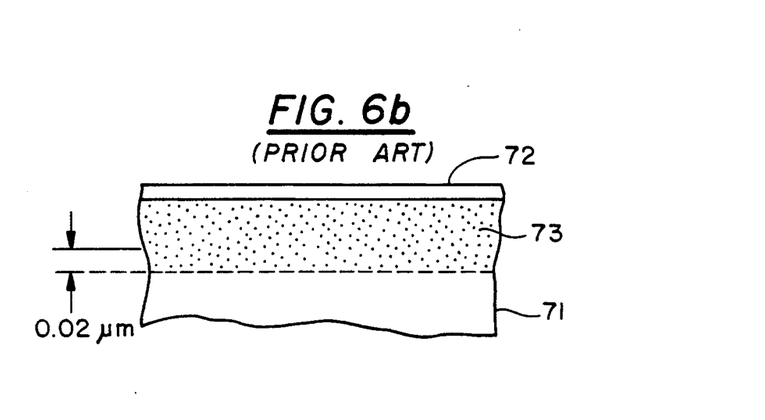

FIG. 6 shows a cross-sectional view of a portion (a) of a silicon wafer processed by use of the apparatus of FIG. 3 according to the second embodiment of this invention, and a cross-sectional view of a portion (b) of a silicon wafer processed by use of a conventional furnace provided with both a heater and reflector, but only a single temperature region. A silicon wafer 71 has an oxide film 72, and an impurity diffusion region 73. The diffusion depth in the case of this invention (portion (a)) is smaller by about 0.02 µm than that in the case of the conventional furnace (portion (b)). This means that the rapid temperature reduction of the present invention after the thermal process can achieve a prescribed diffusion depth because undesirable diffusion caused by excessive residual heat can be avoided.

As described above, according to the second embodiment of this invention, the semiconductor wafer thermal processing apparatus is provided with two heaters, one for the higher temperature region and the other for the lower temperature region. After the predetermined thermal processing in the higher temperature region, the thermally processed semiconductor wafers are moved into the lower temperature region. This can increase the wafer temperature reducing speed after the required thermal process. Therefore, parasitic effects such as undesirable extension of the diffusion layer, which are caused by excessive thermal processing during the temperature reducing, can be significantly suppressed. In addition, the curtailment of the temperature reducing time can enhance the throughput in thermal processing. Further, in this embodiment, the thermally processed wafers are not taken out from the apparatus immediately after the thermal process. Thus, the wafers can be cooled down without occurrence of temperature differences on the surface thereof. As a result, the deformation of wafers, such as "slip" or "warp" can be prevented. Moreover, this embodiment has an advantage that the above-described apparatus can be realized by a simple modification, i.e., only changing the number of turns of heater winding.

Furthermore, this invention is not limited to the above-described embodiment. For example, the heat capacity of the heater can be changed by selecting the material thereof having different specific heat, instead of changing the number of turns of heater winding. Moreover, the number of heaters is not limited to two. For example, three heaters or more may be employed. The addition of more heaters can achieve faster temperature reducing after thermal processing. Further, this embodiment has been described with respect to performing a thermal oxidation process. However, the application is not limited to this. For example, the embodiment may also be employed with any thermal process, or thin film formation by use of CVD (chemical vapor deposition). Further, instead of the quartz reaction tube, any cylindrical furnace may also be utilized.

Figure 7:
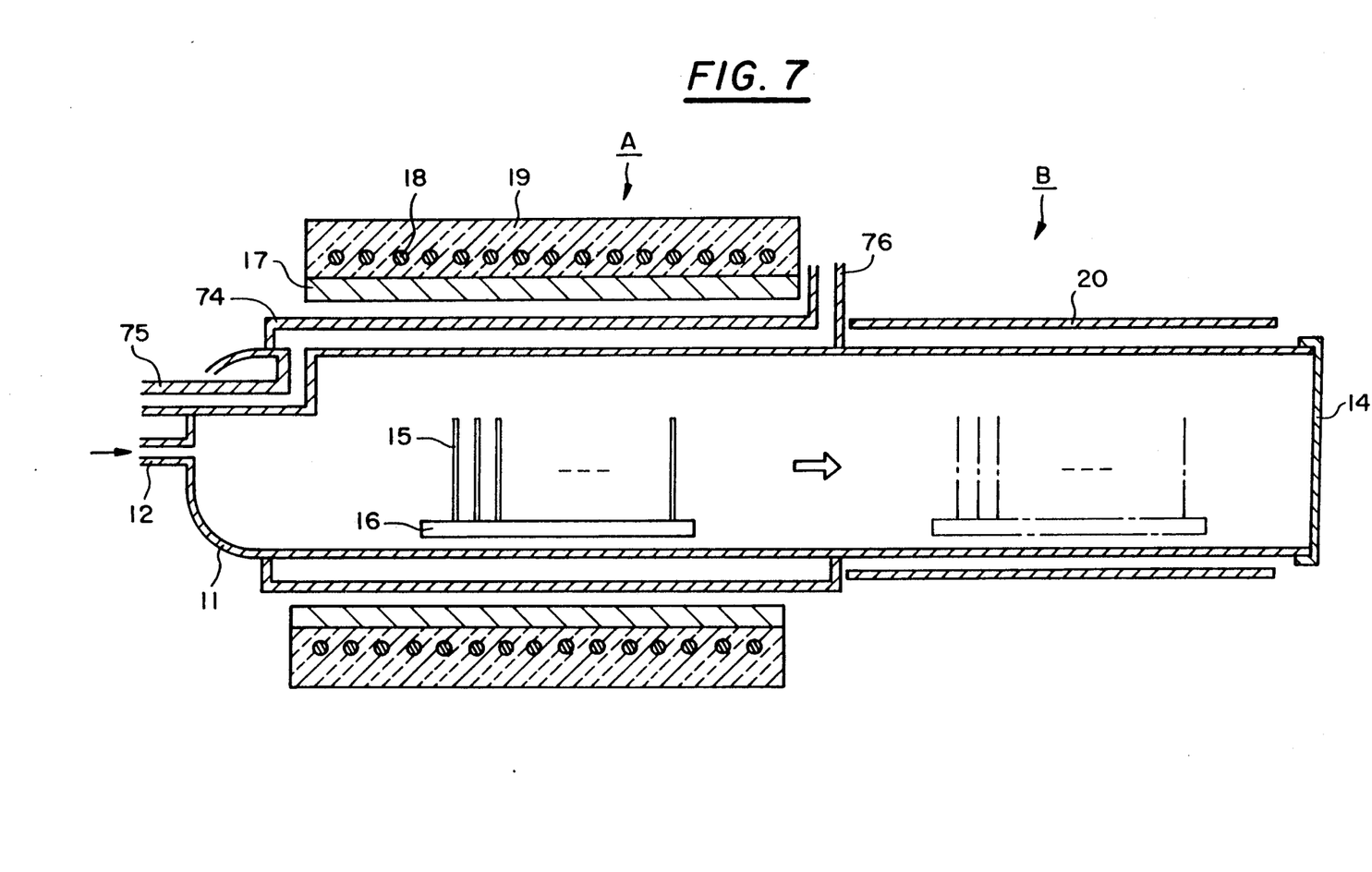
FIG. 7 is a cross-sectional view illustrating a third embodiment of the present invention.

Next, a third embodiment according to the present invention will be described with reference to FIG. 7. This embodiment is an improved modification of the semiconductor wafer thermally processing apparatus shown in FIG. 1. The improvement is such that contaminations generated from the heater 18 are prevented from having any adverse effects on semiconductor wafers. Specifically, in a higher temperature region A, an outer tube 74 is provided between the heater 18 and the quartz reaction tube 11. The outer tube 74 has a second gas-introducing inlet 75 at its one end, and a gas-exhausting outlet 76 at its other end.

In the higher temperature region A, plural semiconductor wafers 15, placed on a quartz boat 16, are exposed to an atmosphere of oxygen gas at 1000° C. generated by the heater 18. The oxygen gas is introduced into the reaction tube 11 through a gas-introducing tube 12 while at the same time, dry nitrogen gas is introduced into the outer tube 74 through the second gas-introducing inlet 75. The dry nitrogen gas is then exhausted through the gas-exhausting outlet 76. The flow of the dry nitrogen gas continues while the thermal processing is performed.

As described above, the higher temperature region A has a double-tube structure including the outer tube 74. The dry nitrogen gas is continuously flowing while the semiconductor wafers 15 are thermally processed. Thus, the wafers 15 are securely protected from contaminations generated from the heater 18. As a result, oxidation films having high quality can be obtained.

Figure 8:
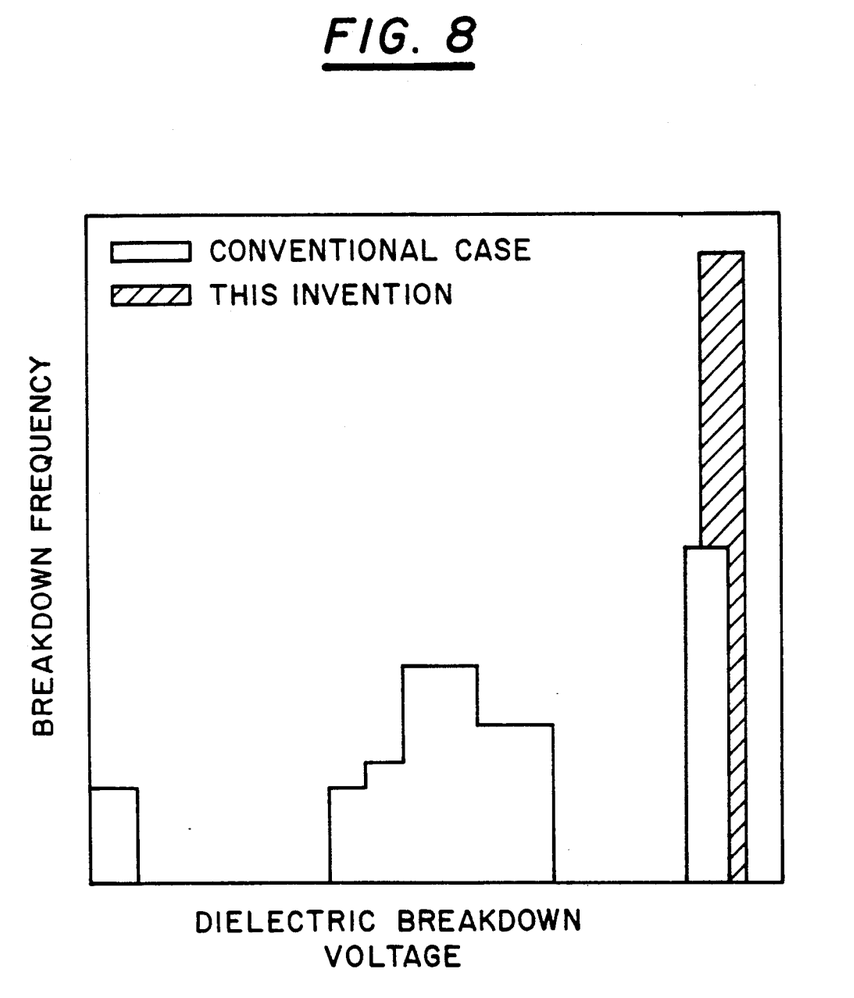
FIG. 8 is a graph illustrating the dielectric breakdown characteristics of an oxide film formed by processes in the third embodiment of the present invention in comparison with that formed by conventional apparatus.

FIG. 8 shows measurements of the dielectric breakdown voltage of the silicon oxide films formed on the silicon wafers by sue of the apparatus in the third embodiment. FIG. 8 also shows measurements in the case of a conventional apparatus having no double-tube structure. As seen from these measurements, according to the third embodiment of this invention, oxide films having high quality can be produced.

Figure 9:
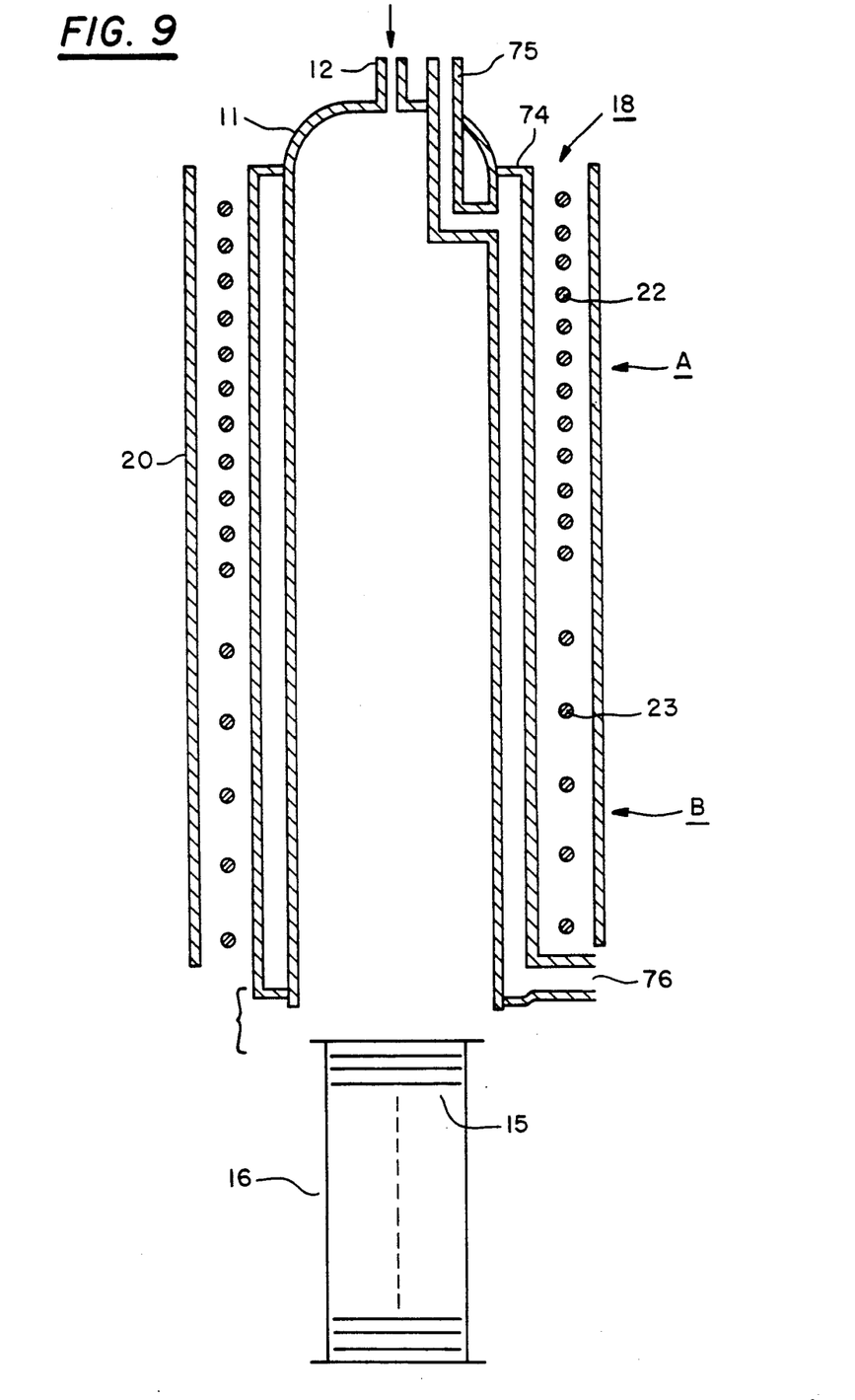
FIG. 9 is a cross-sectional view illustrating a fourth embodiment of the present invention.

Next, a fourth embodiment according to the present invention will be described with reference to FIG. 9. This embodiment is an improved modification of the semiconductor wafer thermal processing apparatus in FIG. 3. Specifically, an outer tube 74 is provided between the heater 18 (comprising the higher temperature heater 22 and the lower temperature heater 23) and the quartz reaction tube 11. The outer tube 74 has a gas-introducing inlet 75 at its upper end, and a gas-exhausting outlet 76 at its lower end. In this embodiment, semiconductor wafers 15 can also be protected from contaminations generated from the heater 18. Thus, silicon oxide films having high quality can be obtained. Here, as with the embodiment of FIG. 7, the gas to be introduced into the outer tube 74 is not limited to nitrogen. Any gas having no adverse effects may be used, such as oxygen, argon and hydrogen chloride.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor wafer thermal processing apparatus comprising:
    a reaction tube having an opening at one side of said reaction tube for inserting said semiconductor wafers;
    a heater provided only at a heating portion of said reaction tube, said heating portion of said reaction tube separated from said opening of said reaction tube; and
    means for reducing the rate of heat radiation out of a cooling portion of said reaction tube, said cooling portion of said reaction tube being near said opening of said reaction tube said reducing means including:
    a reflector provided at said cooling portion of said reaction tube for controlling said rate at which said semiconductor wafers are cooled and excluding a heater in said cooling portion of said reaction tube.

2. The apparatus of claim 1, further comprising an outer tube surrounding said heating portion of said reaction tube and separating said heater from said reaction tube for allowing gas to pass between said heater and said reaction tube.

3. The apparatus of claim 1, wherein said reaction tube is made of quartz.

4. The apparatus of claim 1, wherein said heater is wound around said reaction tube.

5. The apparatus of claim 4, further comprising heat insulation means, surrounding said heater.

6. The apparatus of claim 4, further comprising heat distributing tube means between said reaction tube and said heater, for evening the distribution of heat along said reaction tube.

7. The apparatus of claim 6, further comprising heat insulation means, surrounding said heater.

8. The apparatus of claim 6, wherein said heat distributing tube means is made of silicon carbide.

9. The apparatus of claim 1, wherein said reflector includes a reflecting tube surrounding said reaction tube, said tube having a heat reflecting face on the inner circumferential surface thereof.

10. The apparatus of claim 9, wherein said heat reflecting face has a mirror finish.

11. The apparatus of claim 9, wherein said reaction tube and said reflecting tube surrounding said reaction tube are both made of quartz.

12. The apparatus of claim 9, wherein said heat reflecting face is formed by a metallic film.

13. The apparatus of claim 12, wherein said metallic film is made of gold.

* * * * *